(12) United States Patent
Ryu et al.

(10) Patent No.: US 12,040,346 B2
(45) Date of Patent: Jul. 16, 2024

(54) FULL-COLOR DISPLAY MODULE WITH ULTRA-WIDE COLOR GAMUT

(71) Applicants: Yung Ryel Ryu, Irvine, CA (US); Ui Kyu Bang, Pyeongtaek-si (KR)

(72) Inventors: Yung Ryel Ryu, Irvine, CA (US); Ui Kyu Bang, Pyeongtaek-si (KR)

( * ) Notice: Subject to any disclaimer, the term of this patent is extended or adjusted under 35 U.S.C. 154(b) by 518 days.

(21) Appl. No.: 17/411,048

(22) Filed: Aug. 24, 2021

(65) Prior Publication Data

US 2021/0384254 A1    Dec. 9, 2021

Related U.S. Application Data

(60) Provisional application No. 63/069,558, filed on Aug. 24, 2020.

(51) Int. Cl.
| | |
|---|---|
| *H01L 27/15* | (2006.01) |
| *H01L 33/28* | (2010.01) |
| *H01L 33/32* | (2010.01) |
| *H01L 33/50* | (2010.01) |
| *H01L 33/58* | (2010.01) |

(52) U.S. Cl.
CPC .......... *H01L 27/156* (2013.01); *H01L 33/28* (2013.01); *H01L 33/32* (2013.01); *H01L 33/504* (2013.01); *H01L 33/58* (2013.01)

(58) Field of Classification Search
CPC ....... H01L 27/156; H01L 33/28; H01L 33/32; H01L 33/504; H01L 33/58
See application file for complete search history.

(56) References Cited

U.S. PATENT DOCUMENTS

| | | | |
|---|---|---|---|
| 2018/0247985 A1* | 8/2018 | Jeon | H10K 59/353 |
| 2021/0043691 A1* | 2/2021 | Yoon | G02B 5/201 |
| 2021/0097943 A1* | 4/2021 | Wyatt | H10K 59/352 |

OTHER PUBLICATIONS

B. J. Kim et al., Output power enhancement of GaN light emitting diodes with p-type ZnO hole injection layer, Applied Physics Letters 94 (2009), p. 103506.

Guan-Bo Lin et al., Effect of a p-ZnO insertion layer on the external quantum efficiency of GaInN light-emitting diodes, Applied Physics Express 8 (2015), p. 092102.

* cited by examiner

*Primary Examiner* — Mark W Tornow (57) ABSTRACT

A full-color display module with an ultra-wide color gamut (UWCG) is based on a specific type of pixel applicable for display. The full-color display module is based on a red-green-cyan-blue-pixel (RGCB-pixel) and thus, includes at least one red-light source, at least one green-light source, at least one cyan-light source, and at least one blue-light source. The full-color display module comprises a substrate that establishes an electrical base for the at least one red-light source, at least one green-light source, at least one cyan-light source, and at least one blue-light source. The full-color display module can display all colors in the color gamut of UWCG, has excellent luminous efficiency and durability, and is advantageous in realizing high resolution by improving the degree of integration of the light source array itself.

28 Claims, 8 Drawing Sheets

FULL-COLOR DISPLAY MODULE WITH ULTRA-WIDE COLOR GAMUT

The current application claims a priority to the U.S. provisional patent application Ser. No. 63/069,558 filed on Aug. 24, 2020, while Aug. 23, 2020 was on a weekend.

The current application also claims a priority to the Chinese patent application 202102170134 filed on Feb. 26, 2021.

FIELD OF THE INVENTION

The present invention relates generally to full-color display modules. More specifically, the present invention provides a full-color display module with an ultra-wide color gamut.

BACKGROUND OF THE INVENTION

Recently, high-quality thin film growth technology and device process technology have been improved, making it possible to manufacture light emitting devices of various sizes. In particular, micro-light-emitting diode (LED) display devices that reproduce full-color images without liquid crystal display (LCD) by directly adjusting the three primary colors of light using micro-LEDs of blue light, green light, and red light of less than 100 micrometers are being actively developed.

Traditionally, micro-LED display manufacturing technology has been largely divided into two types depending on how red-green-blue-pixels (RGB-pixels) are configured. The first is a method of forming an RGB-pixel by combining individual micro-LEDs of blue light, green light, and red light, and the second is a method of constructing an RGB-pixel by combining blue-light micro-LEDs and blue-light micro-LEDs wrapped with green-light and red-light phosphors. Similar to the latter case, an RGB-pixel can be made in the form of wrapping ultraviolet (UV) light micro-LEDs with blue-light, green-light, and red-light phosphors.

In the former case, productivity and yield are not high due to the difficulty of assembling individual red light, green light, and blue light micro-LEDs by transferring them to a display substrate to form RGB-pixels. In addition, in the case of green light and red-light micro-LEDs, especially red-light micro-LEDs, the luminous efficiency is very low compared to the blue-light micro-LED, which lowers the overall efficiency of the RGB-pixel. And the red-light micro-LED is thermally unstable compared to blue-light and green-light micro-LED because it is made of non-nitride semiconductor. Therefore, it is not easy to establish the stability of the reproduced color with the red-light micro-LED made of non-nitride semiconductor because the emission wavelength can easily be changed under the influence of the ambient temperature.

In the latter case, it is basically consisted of a blue-light micro-LED array in a monolithic chip process. Since the blue-light micro-LEDs, placed in specific locations, are wrapped with green-light and red-light phosphors to form an RGB-pixel, the productivity is superior compared to the former. However, since it is not easy to make the performance of the micro-LEDs constituting the array uniformly, and the conversion efficiency of the phosphors is different and not good enough, the display efficiency may not be better than the former case.

Therefore, a new pixel-based full-color display module and a manufacturing method should be developed in order to improve the performance and lower the manufacturing cost of the micro-LED display, while accomplishing the color gamut broader than the BT. 2020 WCG (Wide Color Gamut).

Figure 1:
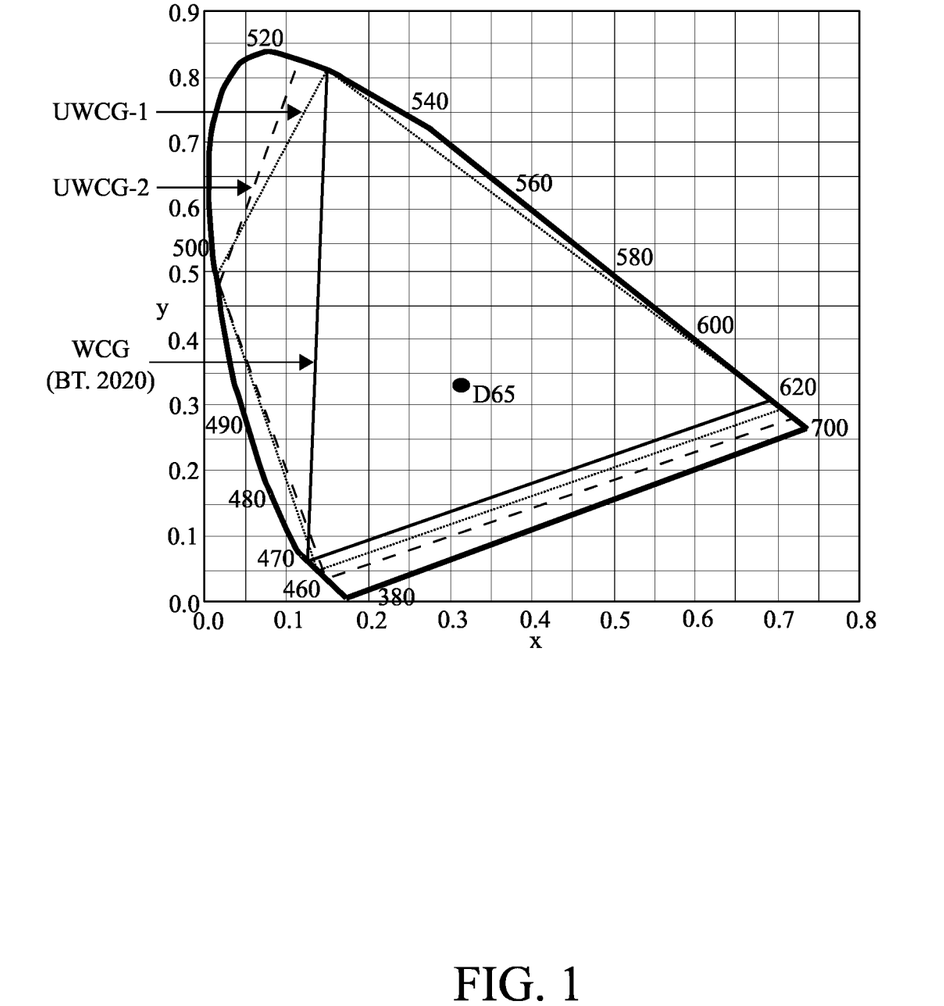
FIG. 1 is a color chromatic diagram showing the UWCG color gamut and light sources required to reproduce the colors of the UWCG color gamut in a preferred embodiment of the present invention.

An object of the present invention to solve the problems of the prior art described above is to provide a new pixel-based full-color display module capable of displaying all colors in a new color gamut of UWCG (Ultra-Wide Color Gamut) covering richer color than BT. 2020 WCG, as shown in FIG. 1. Another object of the present invention is to implement the pixels of such a full-color module with a micro-LED array. The micro-LEDs constituting each pixel of the invented full-color module show excellent luminous efficiency, and excellent durability due to low leakage current and high emission efficiency. In addition, the present invention is to improve the degree of integration of the LED array itself to provide a full-color module that is advantageous for achieving higher display resolution.

DETAIL DESCRIPTIONS OF THE INVENTION

All illustrations of the drawings are for the purpose of describing selected versions of the present invention and are not intended to limit the scope of the present invention.

In reference to FIGS. 1 through 6, the present invention is a full-color display module with an ultra-wide color gamut (UWCG) based on a specific type of pixel applicable for display. The present invention is based on a red-green-cyan-blue-pixel (RGCB-pixel) 111:111-1/111-2 and thus, comprises at least one red-light source R, at least one green-light source G, at least one cyan-light source C, and at least one blue-light source B. The present invention comprises at least one substrate 35 that establishes an electrical base for the at least one red-light source R, at least one green-light source G, at least one cyan-light source C, and at least one blue-light source B. The present invention can display all colors in the color gamut of UWCG, has excellent luminous efficiency and durability, and is advantageous in realizing high resolution by improving the degree of integration of the light source array itself.

The general configuration of the aforementioned components provides a full-color module with UWCG. With reference to FIG. 1, in order for the present invention to display all colors of high color saturation in the color gamut of UWCG, the at least one red-light source R is configured to emit at a peak wavelength of 630 nanometers (nm) to 660 nm, the at least one green-light source G is configured to emit at a peak wavelength of 515 nm to 560 nm, the at least one cyan-light source C is configured to emit at a peak wavelength of 490 nm to 510 nm, and the at least one blue-light source B is configured to emit at a peak wavelength of 455 nm to 470 nm. The at least one red-light source R, the at least one green-light source G, the at least one cyan-light source C, and the at least one blue-light source B are mounted onto the at least one substrate 35 in order for the at least one substrate 35 to physically and electrically support the at least one red-light source R, the at least one green-light source G, the at least one cyan-light source C, and the at least one blue-light source B.

Figure 4:
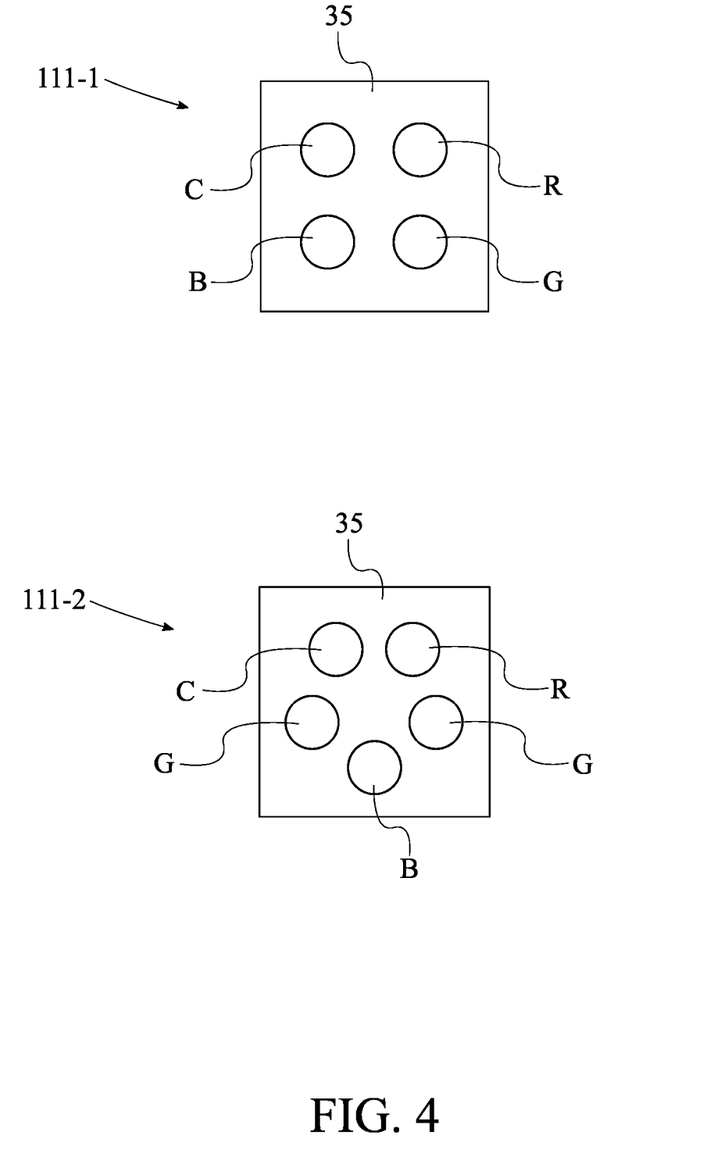
FIG. 4 is a top view of a red-green-cyan-blue-pixel (RGCB-pixel) for reproducing each of the UWCG-1 and UWCG-2 color gamut of FIG. 1.

In one embodiment of the present invention and with reference to FIG. 4, the at least one green-light source G is a single green-light source. In order for the single green-light source to emit a rich green hue, the single green-light source is configured to emit at a peak wavelength of 520 nm to 535 nm. In another embodiment, the at least one green-light source G is a plurality of green-light sources. The plurality of green-light sources comprises a first green-light source and a second green-light source. In order for the first green-light source and the second green-light source to emit a rich green hue, the first green-light source is configured to emit at a peak wavelength of 515 nm to 530 nm and the second green-light source is configured to emit at a peak wavelength of 540 nm to 560 nm.

In order for the at least one green-light source G to efficiently emit green light, the at least one green-light source G comprises at least one blue-light light-emitting diode (LED) and at least one green-light phosphor. The at least one green-light phosphor is configured to convert blue light from the at least one blue-light LED to green light. In more detail, the at least one green-light phosphor causes blue light from the at least one blue-light LED to change to green light when blue light from the at least one blue-light LED is radiated through the at least one green-light phosphor. In one embodiment, a p-type layer of the at least one blue-light LED is made of gallium nitride (GaN). In more detail, the at least one blue-light LED includes a device structure that includes the p-type layer. The p-type layer includes a GaN-based nitride semiconductor. In another embodiment, the at least one blue-light LED is at least one Hybrid LED, and a p-type layer of the at least one Hybrid LED is made of GaN and zinc oxide (ZnO). In more detail, the at least one Hybrid LED includes a device structure manufactured in a conventional semiconductor process that includes the p-type layer. The p-type layer includes a ZnO-based oxide semiconductor and a GaN-based nitride semiconductor. Further, the at least one blue-light LED is preferably a micro-LED manufactured with a chip size of 0.5 micrometers to 50 micrometers for high resolution.

In order for the at least one blue-light source B to efficiently emit blue light, the at least one blue-light source B is at least one blue-light LED. In one embodiment, a p-type layer of the at least one blue-light LED is made of GaN. In more detail, the at least one blue-light LED includes a device structure that includes the p-type layer. The p-type layer includes a GaN-based nitride semiconductor. In another embodiment, the at least one blue-light LED is at least one Hybrid LED, and a p-type layer of the at least one Hybrid LED is made of GaN and ZnO. In more detail, the at least one Hybrid LED includes a device structure manufactured in a conventional semiconductor process that includes the p-type layer. The p-type layer includes a ZnO-based oxide semiconductor and a GaN-based nitride semiconductor. Further, the at least one blue-light LED is preferably a micro-LED manufactured with a chip size of 0.5 micrometers to 50 micrometers for high resolution.

In order for the at least one cyan-light source C to efficiently emit cyan light, the at least one cyan-light source C is at least one cyan-light LED. In one embodiment, a p-type layer of the at least one cyan-light LED is made of GaN. In more detail, the at least one cyan-light LED includes a device structure that includes the p-type layer. The p-type layer includes a GaN-based nitride semiconductor. In another embodiment, the at least one cyan-light LED is at least one Hybrid LED, and a p-type layer of the at least one Hybrid LED is made of GaN and ZnO. In more detail, the at least one Hybrid LED includes a device structure manufactured in a conventional semiconductor process that includes the p-type layer. The p-type layer includes a ZnO-based oxide semiconductor and a GaN-based nitride semiconductor. Further, the at least one cyan-light LED is preferably a micro-LED manufactured with a chip size of 0.5 micrometers to 50 micrometers for high resolution.

In order for the at least one red-light source R to efficiently emit red light, the at least one red-light source R comprises at least one cyan-light LED and at least one red-light phosphor. The at least one red-light phosphor is configured to convert cyan light from the at least one cyan-light LED to red light. In more detail, the at least one red-light phosphor causes cyan light from the at least one cyan-light LED to change to red light when cyan light from the at least one cyan-light LED is radiated through the at least one red-light phosphor. In one embodiment, a p-type layer of the at least one cyan-light LED is made of GaN. In more detail, the at least one cyan-light LED includes a device structure that includes the p-type layer. The p-type layer includes a GaN-based nitride semiconductor. In another embodiment, the at least one cyan-light LED is at least one Hybrid LED, and a p-type layer of the at least one Hybrid LED is made of GaN and ZnO. In more detail, the at least one Hybrid LED includes a device structure manufactured in a conventional semiconductor process that includes the p-type layer. The p-type layer includes a ZnO-based oxide semiconductor and a GaN-based nitride semiconductor. Further, the at least one cyan-light LED is preferably a micro-LED manufactured with a chip size of 0.5 micrometers to 50 micrometers for high resolution.

Alternatively, in order for the at least one red-light source R to efficiently emit red light, the at least one red-light source R comprises at least one blue-light LED and at least one red-light phosphor. The at least one red-light phosphor is configured to convert blue light from the at least one blue-light LED to red light. In more detail, the at least one red-light phosphor causes blue light from the at least one blue-light LED to change to red light when blue light from the at least one blue-light LED is radiated through the at least one red-light phosphor. In one embodiment, a p-type layer of the at least one blue-light LED is made of GaN. In more detail, the at least one blue-light LED includes a device structure that includes the p-type layer. The p-type layer includes a GaN-based nitride semiconductor. In another embodiment, the at least one blue-light LED is at least one Hybrid LED, and a p-type layer of the at least one Hybrid LED is made of GaN and ZnO. In more detail, the at least one Hybrid LED includes a device structure manufactured in a conventional semiconductor process that includes the p-type layer. The p-type layer includes a ZnO-based oxide semiconductor and a GaN-based nitride semiconductor. Further, the at least one blue-light LED is preferably a micro-LED manufactured with a chip size of 0.5 micrometers to 50 micrometers for high resolution.

Figure 3:
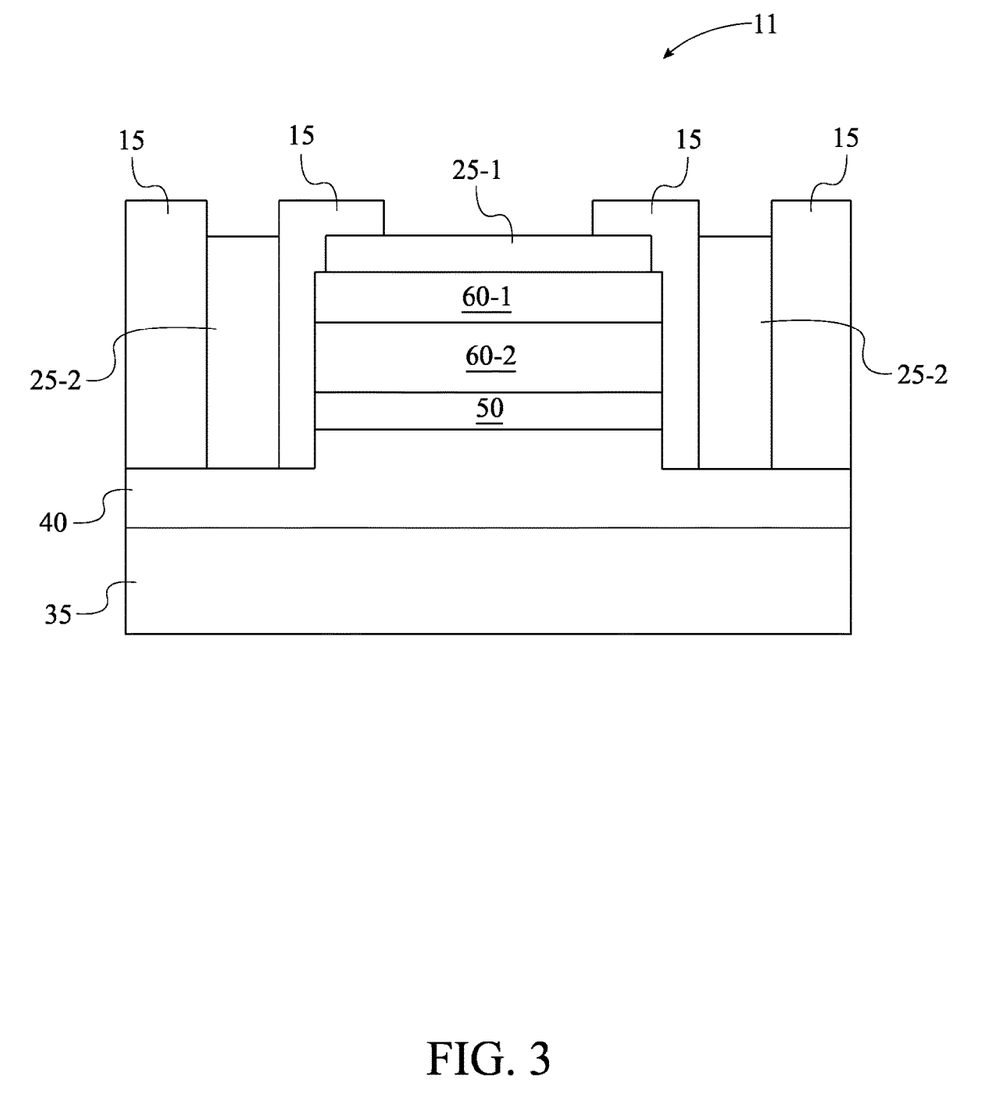
FIG. 3 is a vertical cross-section structure diagram of a Hybrid LED.

Specifically and with reference to FIG. 3, the Hybrid LED comprises a n-type nitride semiconductor layer 40 epitaxially deposited on the substrate to supply electrons, a light-generating active layer 50 epitaxially deposited on the n-type nitride semiconductor layer, and a p-type epi layer structure to supply holes composed of a p-type nitride semiconductor layer 60-1 epitaxially deposited on the active layer 50 and a p-type oxide semiconductor layer 60-2 epitaxially deposited on the top surface of the p-type nitride semiconductor layer 60-1, in sequential. In this case, the p-type oxide semiconductor layer 60-2 epitaxially stacked on the p-type nitride semiconductor layer 60-1 may be composed of a thin film structure in which an As-doped p-type ZnO layer is deposited. The p-type ZnO layer serves to increase the light output power by providing extra holes to the active layer 50.

Figure 2:
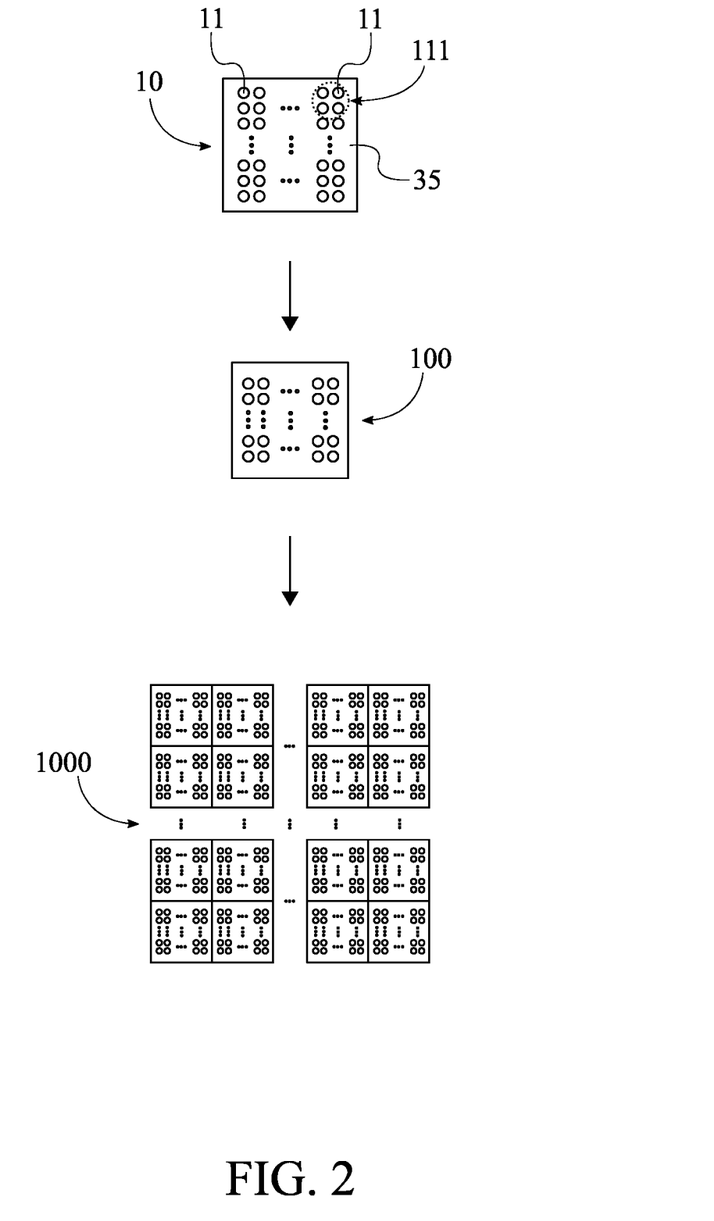
FIG. 2 is a diagram illustrating a process of manufacturing a display panel with the at least one LED array layer.

With reference to FIGS. 2 and 3, the feature of the above-described Hybrid LED comprises the p-type layer structure with p-type heterogeneous materials, in which the p-type ZnO layer is deposited on the p-type nitride semiconductor layer 60-1 by an epitaxy single crystal growth method. It is characterized by being composed of oxide and nitride semiconductor layers. As described in detail in the above cited documents, since a Hybrid LED has higher light efficiency than a conventional GaN micro-LED composed of only nitride semiconductor layers, a high-efficiency display panel 1000 can be developed with a Hybrid LED. The chip process of making the above-described Hybrid LEDs is completed by forming a p-electrode 25-1 and an n-electrode 25-2 made of metal with good reflectivity, and an insulating passivation layer 15.

Figure 5:
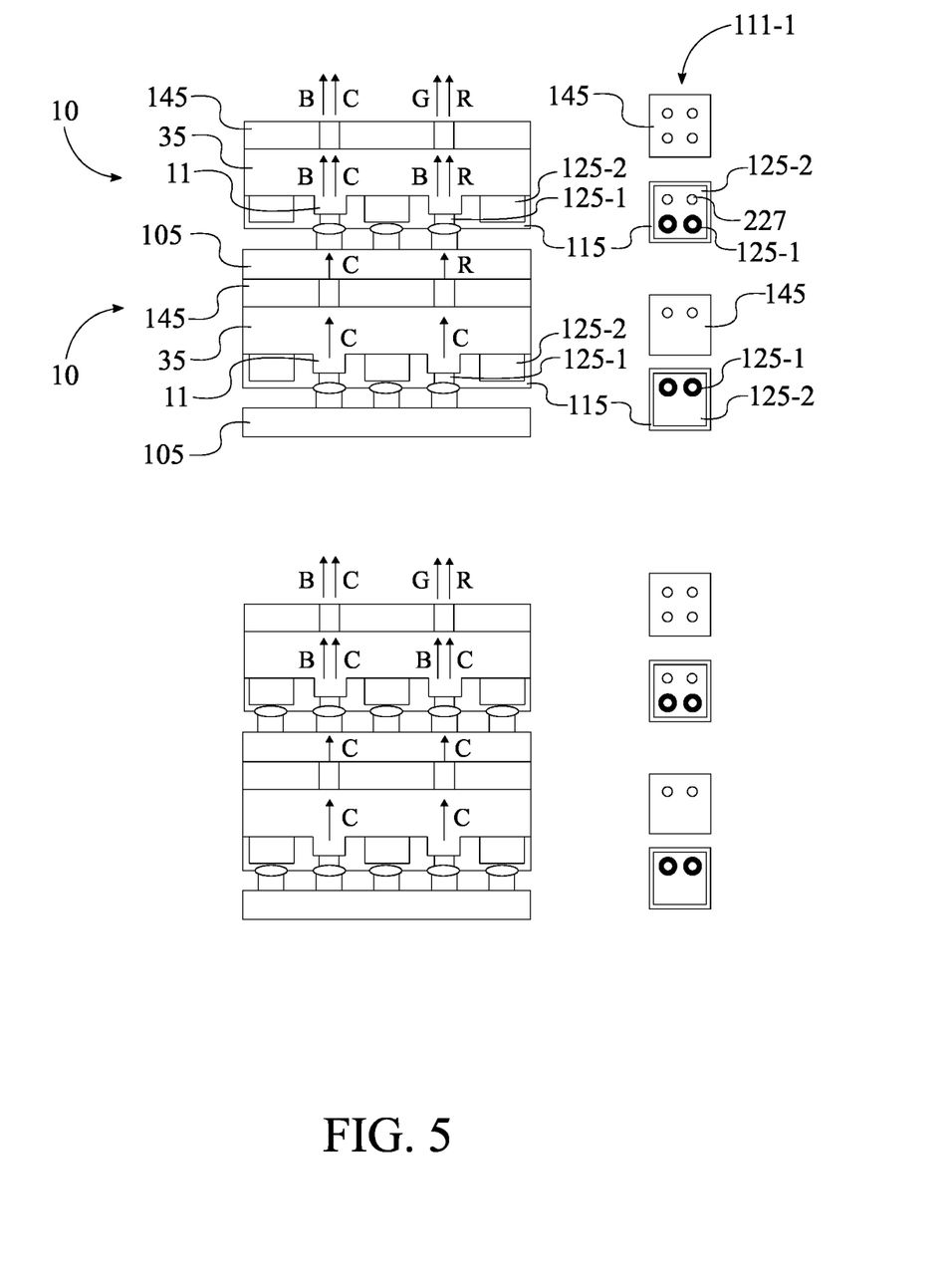
FIG. 5 is a cross-sectional view of two embodiments of the present invention.
Figure 6:
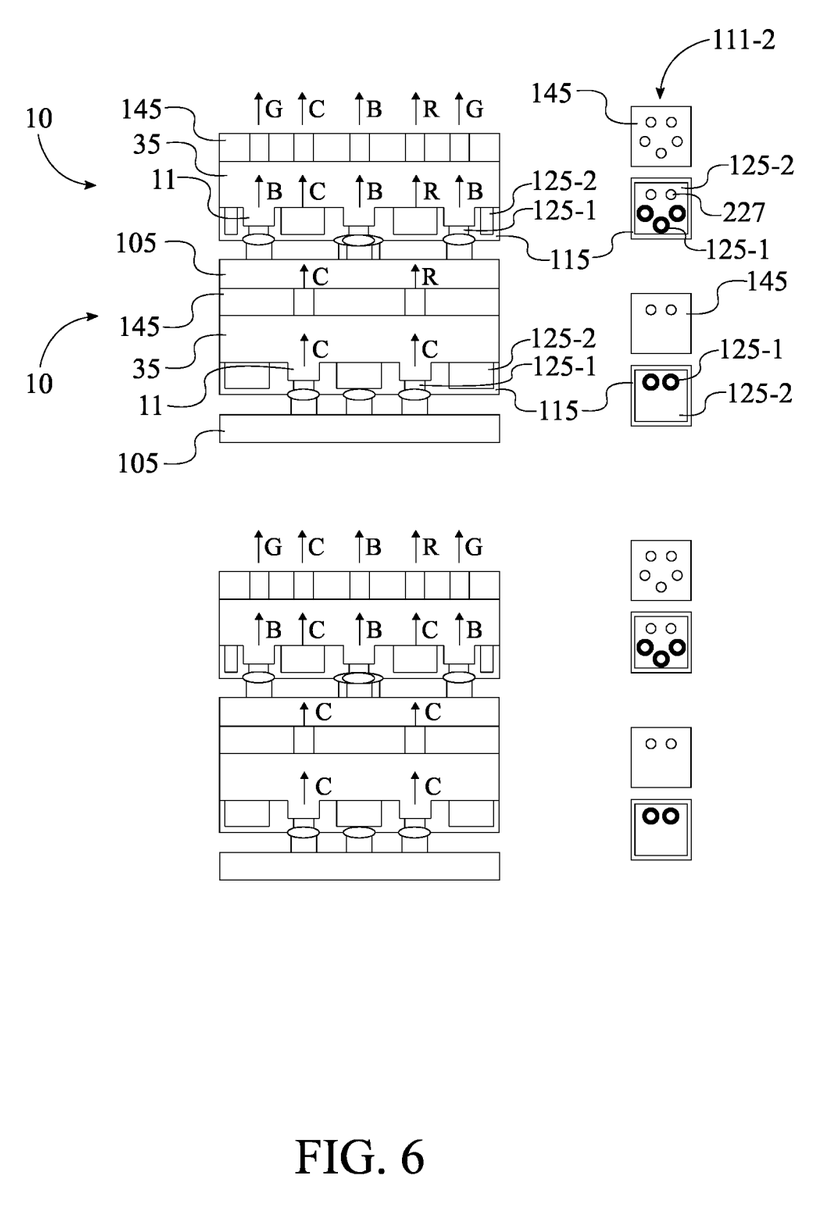
FIG. 6 is a cross-sectional view of two other embodiments of the present invention.

In order to form a complete full-color module and with reference to FIGS. 2 and 5, the present invention may further comprise at least one thin-film transistor (TFT) layer 105, and the at least one red-light source R, at least one green-light source G, at least one blue-light source B, the at least one cyan-light source C, and the at least one substrate 35 are arranged into at least one LED array layer 10. The at least one TFT layer 105 is stacked onto the at least one LED array layer 10 and the at least one LED array layer 10 is electronically connected to the at least one TFT layer 105. In more detail, the at least one LED array layer 10 is preferably bonded to the at least one TFT layer 105 as a driving switch controller. Further, a full-color display panel 1000 of various sizes can be manufactured by aligning in side by side multiple of the full-color modules comprised of the at least one LED array layer 10 and the at least one TFT layer 105.

The complete full color module capable of reproducing the UWCG color gamut, and in particular, a manufacturing method of the RGCB-pixel 111-1 is described in detail. In this case, as described above and with reference to FIGS. 5 and 6, when mentioning the pixel unit required for realizing full color on the basis of emitting light color, the pixel unit is generally referred to as the RGCB-pixel 111-1 for both the UWCG-1 and UWCG-2 color gamut. However, for the case it is necessary to explicitly indicate the number of light sources in the pixel, the pixel unit is referred to as the RGCB-pixel 111-1 or the RGGCB-pixel 111-2.

In one embodiment and with reference to FIG. 5, the RGCB-pixel 111-1 is composed of four-color light sources in the full color module for reproduction of the UWCG-1 color gamut. In this case, the at least one LED array layer 10 comprises a first blue-light LED, a second blue-light LED, a first cyan-light LED, and a second cyan-light LED, a green-light phosphor, and a red-light phosphor. In the case of the RGCB-pixel 111-1, the first blue-light LED and the second blue-light LED each are configured to emit at a peak wavelength of 455 nm to 470 nm, and the first cyan-light LED and the second cyan-light LED each are configured to emit at a peak wavelength of 490 nm to 510 nm. The first blue-light LED, a second blue-light LED, a first cyan-light LED, and a second cyan-light LED are arranged in a square shape as in the embodiment to configure the full-color pixel of the at least one LED array layer 10. Furthermore, the green-light phosphor is configured to convert blue light from the first blue-light LED into green light with a peak wavelength of 520 nm to 535 nm and the red-light phosphor is configured to convert cyan light from the first cyan-light LED into red light with the previously mentioned peak wavelength.

In another embodiment and with reference to FIG. 5, the RGCB-pixel 111-1 is composed five-color light sources in the full color module for reproduction of the UWCG-2 color gamut. In this case, the at least one LED array layer 10 comprises a first blue-light LED, a second blue-light LED, a third blue-light LED, a first cyan-light LED, a second cyan-light LED, a first green-light phosphor, a second green-light phosphor, and a red-light phosphor. The first blue-light LED, the second blue-light LED, and the third blue-light LED are configured to emit at a peak wavelength of 455 nm to 470 nm, and the first cyan-light LED and the second cyan-light LED are configured to emit at a peak wavelength of 490 nm to 510 nm. The first blue-light LED, the second blue-light LED, the third blue-light LED, the first cyan-light LED, and the second cyan-light LED are arranged in a pentagonal shape. Further, the first green-light phosphor is configured to convert blue light of the first blue-light LED into green light with a peak wavelength of 515 nm to 530 nm, the second green-light phosphor is configured to convert blue light of the second blue-light LED into green light with a peak wavelength of 540 nm to 560 nm, and the red-light phosphor is configured to convert cyan light from the first cyan-light LED into red light with the previously mentioned wavelength. Alternatively, the at least one LED array layer 10 comprises a first blue-light LED, a second blue-light LED, a third blue-light LED, a first cyan-light LED, a second cyan-light LED, a green-light phosphor, a first red-light phosphor, and a second red-light phosphor. The first blue-light LED, the second blue-light LED, and the third blue-light LED are configured to emit at a peak wavelength of 455 nm to 470 nm, and the first cyan-light LED and the second cyan-light LED are configured to emit at a peak wavelength of 490 nm to 510 nm. The first blue-light LED, the second blue-light LED, the third blue-light LED, the first cyan-light LED, and the second cyan-light LED are arranged in a pentagonal shape. Further, the green-light phosphor is configured to convert blue light of the first blue-light LED into green light with a peak wavelength of 520 nm to 535 nm, the first red-light phosphor is configured to convert blue light of the second blue-light LED into red light with the previously mentioned wavelength, and the second red-light phosphor is configured to convert cyan light from the first cyan-light LED into red light with the previously mentioned wavelength.

Similarly, the at least one LED array layer 10 comprises a first cyan-light LED, a second cyan-light LED, a third cyan-light LED, a first blue-light LED, a second blue-light LED, a green-light phosphor, a first red-light phosphor, and a second red-light phosphor. The first cyan-light LED, the second cyan-light LED, and the third cyan-light LED are configured to emit at a peak wavelength of 490 nm to 510 nm, and the first blue-light LED and the second blue-light LED are configured to emit at a peak wavelength of 455 nm to 470 nm. The first cyan-light LED, the second cyan-light LED, the third cyan-light LED, the first blue-light LED, and the second blue-light LED are arranged in a pentagonal shape. Further, the green-light phosphor is configured to convert blue light of the first blue-light LED into green light with a peak wavelength of 520 nm to 535 nm, the first red-light phosphor is configured to convert cyan light of the second cyan-light LED into red light with the previously mentioned wavelength, and the second red-light phosphor is configured to convert cyan light from the third cyan-light LED into red light with the previously mentioned wavelength.

As mentioned previously and with reference to FIGS. 5 and 6, a full-color display panel 1000 of various sizes can be manufactured by aligning in side by side multiple of the full-color modules comprised of the at least one LED array layer 10 and the at least one TFT layer 105. In this case, the at least one LED array layer 10 is a plurality of LED array layers 10 and the at least one TFT layer 105 is a plurality of TFT layers 105. Each of the plurality of TFT layers 105 is stacked onto a corresponding LED array layer from the plurality of LED array layers 10 in order to form a plurality of a layer pairs. The plurality of layer pairs is configured to orthogonally project at least one pixel pattern from each of the plurality of LED array layers 10. Further, the present invention may further comprise at least one optical film 145 and the at least one LED array layer 10 comprises at least one layer LED 11. The at least one optical film 145 comprises at least one discrete film section and a continuous film section. The at least one optical film 145 is stacked onto the at least one LED array layer 10, opposite the TFT layer 105 in order to allow light from the at least one layer LED 11 to shine through the at least one optical film 145. The discrete film section is surrounded by the continuous film section. Further, the at least one discrete film section is optical communication with the at least one layer LED 11. The surrounding film section is opaque in visible light. In more detail, the whole area of the optical film is opaque in visible light except the part of the pixel pattern of the at least one discrete film section corresponding to the pixel of the at least one layer LED 11. Moreover, the present invention may further comprise at least one green-light phosphor and/or at least one red-light phosphor to convert one light color to another. In this case, the at least one green-light phosphor and/or the at least one red-light phosphor is integrated into the at least one discrete film section.

In one embodiment and with reference to FIG. 5, the plurality of LED layers comprises a blue-light LED array layer and a cyan-light LED array layer. Each of the plurality of LED array layers comprises at least one layer LED 11. The at least one layer LED 11 of the blue-light LED array includes the first blue-light LED and the second blue-light LED. Further, the at least one layer LED 11 is arranged into a blue-green-pixel (BG-pixel) pattern. In more detail, the at least one optical film 145 with the green-light phosphor is used to convert blue light from the first blue-light LED into green light. The at least one layer LED 11 of the cyan-light LED array layer includes the first cyan-light LED and the second cyan-light LED. Further, the at least one layer LED 11 of the cyan-light LED array layer is arranged into a red-cyan-pixel (RC-pixel) pattern. In more detail, the at least one optical film 145 with the red-light phosphor is used to convert cyan light from the first cyan-light LED into red light. In another embodiment and with reference to FIG. 6, the at least one layer LED 11 of the blue-light LED array layer includes the first blue-light LED, the second blue-light LED, and the third blue-light LED. Further, the at least one layer LED 11 of the blue-light LED array is arranged into a blue-green-red pixel (BGR-pixel) pattern. In more detail, the at least one optical film 145 with the green-light phosphor and the red-light phosphor is used to convert blue light from the first blue-light LED into green light and blue light from the second blue-light LED into red light. The at least one layer LED 11 of the cyan-light LED array layer includes the first cyan-light LED and the second cyan-light LED. Further, the at least one layer LED 11 of the cyan-light LED array layer is arranged into RC-pixel pattern. In more detail, the at least one optical film 145 with the red-light phosphor is used to convert cyan light from the first cyan-light LED into red light.

Supplemental Description

The present invention relates to a full-color display module based on a specific type of pixel applicable for display. The full-color display module is based on an RGCB-pixel composed of four-color light sources of red R in a wavelength range of 630 nm to 660 nm, green G in a wavelength range of 515 nm to 560 nm, cyan C in a wavelength range of 490 nm to 510 nm and blue B in a wavelength range of 455 to 470 nm. In this case, the green-light source G may be composed of a single green-light source having a peak wavelength of 520 nm to 535 nm, or may be composed of two green-light sources having a peak wavelength of 515 nm to 530 nm and a peak wavelength of 540 nm to 560 nm. The full-color display module of the present invention can display a rich hue in the color gamut of UWCG, has excellent luminous efficiency and durability, and is advantageous in realizing high resolution by improving the degree of integration of the LED array itself.

An object of the present invention to solve the problems of the prior art described above is to provide a new pixel-based full-color display module capable of displaying all colors in a new color gamut of UWCG (Ultra-Wide Color Gamut) covering richer color than BT. 2020 WCG. Another object of the present invention is to implement the pixels of such a full-color display module with a micro-LED array. The micro-LEDs constituting each pixel of the invented full-color display module show excellent luminous efficiency, and excellent durability due to low leakage current. In addition, the present invention is to improve the degree of integration of the LED array itself to provide a full-color display module that is advantageous for achieving higher display resolution.

The present invention has been made as a result of careful examination in order to solve the above-described problems, and the summary is the same as described in the claims below.

The full-color display module in the present invention is based on the RGCB-pixel, consisted of four light sources of red R, green G, cyan C, and blue B. The invented RGCB-pixel full-color display module may include four light sources; a red-light source R with a peak wavelength of 630 nm to 660 nm; a green-light source G with a peak wavelength of 515 nm to 560 nm; a cyan-light source C with a peak wavelength of 490 nm to 510 nm; and a blue-light source B with a peak wavelength of 455 to 470 nm.

The green-light source G, described above, may be formed of a single element of green light source 1 having a peak wavelength of 520 to 535 nm.

The green-light source G, described above, may be formed of two elements of green-light source G 2 having a peak wavelength of 515 to 530 nm, and green-light source G 3 having a peak wavelength of 540 nm to 560 nm.

The above-described blue-light source B may be either a blue light GaN LED, or a blue light Hybrid LED having the p-type layer formed with ZnO and GaN.

The above-described cyan-light source C may be either a cyan light GaN LED, or a cyan light Hybrid LED having the p-type layer formed with ZnO and GaN.

Green-light source G, described above, is configured by combining a blue light LED with green-light phosphor, and the blue light LED may be a GaN LED or a Hybrid LED having a p-type layer made of ZnO and GaN, and green-light phosphor is to convert blue light to green light of the corresponding peak wavelength.

Green-light source G 2 and green-light source G 3, described above, are configured by combining green-light phosphor 2 and green-light phosphor 3 to blue-light LEDs, respectively. The above-described blue-light LED may be a GaN LED or a blue-light Hybrid LED having a p-type layer made of ZnO and GaN. Green-light phosphor 2 and 3 may convert blue light to green light having respective peak wavelengths, described above.

The above-described red-light source R is configured by combining a cyan-light LED with a red-light phosphor, and the cyan-light LED may be a GaN LED or a Hybrid LED having a p-type layer made of ZnO and GaN. The red-light phosphor may convert cyan light to red light having a corresponding peak wavelength.

Alternatively, the above-described red-light source R is configured by combining a blue-light LED with a red-light phosphor, and the blue-light LED may be a GaN LED or a Hybrid LED having a p-type layer made of ZnO and GaN. The red-light phosphor may convert blue light to red light having a corresponding peak wavelength.

The above-described color light sources may be configured as an LED array layer 10, and the LED array layer 10 may have a structure in which electrodes are connected by being stacked on a TFT layer 105.

The unit pixel of the above-described LED array is composed of two blue-light LEDs and two cyan light LEDs, and green-light phosphor 1 for converting blue light into green light having a peak wavelength of 520 to 535 nm is coupled to any one of the two blue-light LEDs, and one of the two cyan-light LEDs may be combined with a red-light phosphor for converting cyan light into red light having a corresponding peak wavelength.

The unit pixel of the above-described LED array layer 10 is composed of three blue-light LEDs and two cyan-light LEDs. Two blue-light LEDs among the above-described three blue-light LEDs, each, may be combined with green-light phosphor 2 to convert blue light into green light with a peak wavelength of 515 nm to 530 nm, and green-light phosphor 3 for converting blue light to green light having a peak wavelength of 540 nm to 560 nm, respectively, and one of the above-described two cyan-light LEDs is combined with a red-light phosphor for converting cyan light to red light of a corresponding peak wavelength.

The unit pixel of the above-described LED array is composed of three blue-light LEDs and two cyan-light LEDs. Two of the above-described three blue-light LEDs, each, may be combined with green-light phosphor 1 to convert blue light green light with a peak wavelength of 520 to 535 nm, and red-light phosphor for converting blue light into red light having a corresponding peak wavelength, and one of the above-described two cyan-light LEDs may be combined with another red-light phosphor for converting cyan light into red light having a corresponding peak wavelength.

The structure in this present invention may be constructed by vertically stacking two layers, each layer of which is consisted of the above-described LED array layer 10 combined with the TFT layer 105. The RGCB-pixel pattern may be formed by orthogonally projecting the pixel pattern of each layer in the above-described structure.

The plurality of LED array layers 105, described above, may include a blue-light LED array layer in which LEDs are arranged to form a BG-pixel pattern or a BGR-pixel pattern; and a cyan-light LED array layer in which LEDs are arranged to form an RC-pixel pattern.

An optical film 145 mounted on the light emitting surface side of the above-described LED array layer 10 may be further included, and the optical film 145 may be opaque to visible light except the area of a pixel pattern corresponding to a pixel of a related LED array layer 10.

The above-described optical film 145 may have a pixel pattern, in which part of the pixel pattern is formed with either a phosphor for converting blue light into green light or a phosphor for converting blue light or cyan light into red light.

If the display panel is configured with a full-color display module based on the RGCB-pixel using five color light sources of red R, green G, cyan C, and blue B in a specific wavelength range as described in the present invention, all rich colors of the UWCG can be reproduced, which is much wider than the WCG of BT. 2020.

If the display panel is configured with a full-color display module based on the RGCB-pixel using four color light sources of red R, green G, cyan C, and blue B in a specific wavelength range as described in the present invention, all rich colors of the UWCG can be reproduced, which is much wider than the WCG of BT. 2020.

Additionally, vertical stacking of a plurality of LED array layers 10 in the president invention can improve the integrated pixel density, brightness, color richness and resolution.

Hereinafter, preferred embodiments of the present invention are described in detail with reference to the above-described drawings. In describing the present invention, when a detailed description of a related known technology may obscure the subject matter of the present invention, a detailed description thereof has been omitted. In the drawings, parts not related to the description of the present invention are omitted, and similar parts are described with similar reference numerals throughout description of the president invention. In whole description of the president invention, when a part "includes" a certain component, it means that other components may be further included rather than excluding other components unless otherwise stated.

First, the full-color display module in the present invention is based on a full-color RGCB-pixel, composed of four-color light sources of red R, green G, cyan C, and blue B, and each of these four-color light sources emits a specific wavelength range to reproduces the colors of the UWCG gamut beyond the conventional WCG gamut.

FIG. 1 is a color chromatic diagram showing the UWCG color gamut and light sources required to reproduce the colors of the UWCG color gamut in a preferred embodiment of the present invention. As an embodiment of the UWCG color gamut, the UWCG-1 color gamut and the UWCG-2 color gamut are specifically illustrated in FIG. 1.

Referring to FIG. 1, in relation to the wavelength band of the four color light sources of red R, green G, cyan C, and blue B for realizing the UWCG color gamut, a red-light source R having an emission peak of 630 nm to 660 nm wavelength; a green-light source G with an emission peak of 515 nm to 560 nm wavelength; a cyan-light source C with an emission peak of 490 nm to 510 nm wavelength; and a blue-light source B having an emission peak of 455 nm to 470 nm wavelength. In this case, more preferably, the peak wavelength of the red-light source R is 645 to 660 nm, the peak wavelength of the cyan-light source C is 495 to 500 nm, and the peak wavelength of the blue-light source B is 460 to 465 nm.

For the green-light source G, the wavelength band may be configured differently for the UWCG-1 color gamut and the UWCG-2 color gamut. Specifically, the UWCG-1 color gamut consists of green-light source G 1 with the emission peak wavelength of 520 nm to 535 nm, more preferably 530 nm to 535 nm. In this case, the pixel unit required for full-color reproduction is the RGCB-pixel, based on the number of light sources. On the other hand, the UWCG-2 color gamut is composed of green-light source G 2 and green-light source G 3; green-light source G 2 with the emission peak wavelength of 515 to 530 nm, more preferably 520 to 525 nm; green-light source G 3 with the emission peak wavelength of 540 to 560 nm, more preferably 545 to 550 nm. For the UWCG-2 color gamut, the pixel unit required for full-color reproduction is the RGGCB-pixel, based on the number of light sources.

Meanwhile, when referring to the pixel unit required for realizing full colors in the present invention, it is collectively referred to as the RGCB-pixel for both the UWCG-1 and UWCG-2 color gamut, based on the type of color. Depending on the number of light sources, as described above, it is referred to as the RGCB-pixel or the RGGCB-pixel.

According to a preferred embodiment of the present invention, the above-described color light sources are composed of the LED array layer 10, and FIG. 2 illustrates in schematic diagram the process of sequentially manufacturing the full-color display module and the LED panel 1000 using the LED array layer 10. The LED array layer 10 is intended to be bonded to a TFT-backplane 105 as a driving switch controller, and as shown in FIG. 2, a full-color display panel 1000 of various sizes can be manufactured by aligning in side by side a number of the full-color display modules consisted of the LED array layer 10. In the embodiment, the LED 11, as a light emitting device constituting the LED array layer 10, is a blue-light LED and a cyan-light LED, and it is desirable to use Hybrid LED' for the LED 11 in order to manufacture the UWCG class full-color display module, as described later.

In addition, the LED 11 should be small LED for high resolution, preferably a "micro-LED" of 0.5 to 50 µm, more preferably 5 to 30 µm. A more detailed summary of the process of manufacturing the RGCB pixel-based full color module capable of reproducing the color of the UWCG gamut using the 'Hybrid micro-LED' 11 as a light emitting device of the LED array is as follows; first, using an epi wafer of a light emitting device structure having the p-type layer composed of a ZnO-based oxide semiconductor and a GaN-based nitride semiconductor, one Hybrid micro-LED array composed of Hybrid micro-LEDs in size of 0.5 to 50 µm, preferably 5 to 30 µm, emitting cyan light with a peak wavelength of 490 to 510 nm, and another Hybrid micro-LED array composed of Hybrid micro-LEDs in size of 0.5 to 50 µm, preferably 5 to 30 µm, emitting blue light with a peak wavelength of 455 to 470 nm, may be fabricated through a conventional semiconductor monolithic integration process.

On the other hand, in the case where the LED 11 is a blue light LED and a cyan light LED as a light emitting device constituting the LED array layer 10, the blue-light source B is made of a blue-light LED itself, and the green-light source G is a blue-light LED combined with a green-light phosphor, the cyan-light source C is made of a cyan light-LED itself, and the red-light source R is made of a cyan-light LED combined with a red-light phosphor. In this case, each of the blue-light LED and the cyan-light LED emits blue and cyan lights having peak wavelengths required for realizing the above-described full color, and the green-light phosphor converts blue light into green light having a peak wavelength required for realizing the above-described full color. The red-light phosphor converts cyan light into red light having a peak wavelength necessary for realizing the above-described full color. In this case, if a full-color pixel is implemented based on the above-described blue-light LED, cyan-light LED, green-light phosphor, and red-light phosphor for realizing UWCG-class full color, It is possible to overcome the technical difficulties occurring when manufacturing full-color pixels composed of four independent LEDs of blue, cyan, green and red lights, and no technical limitation related to the availability of cyan light phosphor excitable by blue light.

The above-described blue-light LEDs and cyan-light LEDs may be made of a GaN-based nitride semiconductor, but the device performance of such GaN-based LED tends to be significantly reduced as the LED is manufactured with a small chip size such as the 'micro-LED' based on such a conventional GaN. In order to avoid such effect of performance decrease as the chip size is smaller, 'Hybrid LED' is most desirable for the above-described blue-light LEDs and cyan-light LEDs. Hybrid LED has a p-type layer composed of GaN-based nitride semiconductor and ZnO-based oxide semiconductor. It is known that device durability may be improved by enhancement of the internal quantum efficiency (IQE) and elimination of ohmic heating due to surface leakage current (Output power enhancement of GaN light emitting diodes with p-type ZnO hole injection layer, B. J. Kim, et al., Applied Physics Letters 94 (2009), Page 103506//Effect of a p-ZnO insertion layer on the external quantum efficiency of GaInN light-emitting diodes, Guan-Bo Lin, et al., Applied Physics Express 8 (2015), Page 092102). If such Hydride LED is used as micro-LED for pixel configuration, the problems related to the emission efficiency of a conventional GaN LED can be solved, and the things described in the above cited documents may be referred to as a part of the present invention.

FIG. 3. shows a vertical cross-sectional structure of an epi layer of a Hybrid micro-LED 11 as an example of a preferred embodiment of the present invention. The Hybrid micro-LED 11 in FIG. 3 is manufactured with a chip size of 0.5 to 50 µm, preferably 5 to 30 µm, and emits blue light with a peak wavelength of 455 to 470 nm or cyan light with a peak wavelength of 490 to 510 nm, as described above. Such Hybrid micro-LED 11 may be manufactured in conventional semiconductor process by using an epi wafer of light emitting device structure made of a GaN-based nitride semiconductor and a ZnO-based oxide semiconductor.

Specifically, Hybrid micro-LED 11 consists of an n-type nitride semiconductor layer 40 epitaxially deposited on the substrate 35 to supply electrons, a light-generating active layer 50 epitaxially deposited on the n-type nitride semiconductor layer 40, and a p-type epi layer structure to supply holes composed of a p-type nitride semiconductor layer 60-1 epitaxially deposited on the active layer 50 to supply holes and p-type oxide semiconductor layer 60-2 epitaxially deposited on the top surface of the p-type nitride semiconductor layer 60-1, in sequential. In this case, the p-type oxide semiconductor layer 60-2 epitaxially stacked on the p-type nitride semiconductor layer 60-1 may be composed of a thin film structure in which an As-doped p-type ZnO layer is deposited. The p-type ZnO layer 60-2 serves to increase the light output power by providing extra holes to the active layer 50.

The feature of the above-described Hybrid micro-LED 11 consists of the p-type layer structure with p-type heterogeneous materials, in which the p-type ZnO layer 60-2 is deposited on the p-type nitride semiconductor layer 60-1 by an epitaxy single crystal growth method. It is characterized by being composed of semiconductor layers. As described in detail in the above cited documents, since Hybrid micro-LED 11 has higher light efficiency than a conventional GaN micro-LED composed of only nitride semiconductor layers, a high-efficiency display panel can be developed with Hybrid micro-LED 11.

The chip process of making the above-described Hybrid micro-LED 11 is completed by forming a p-electrode 25-1 and an n-electrode 25-2 made of metal with good reflectivity, and an insulating passivation layer 15.

Next, as a preferred embodiment of the present invention, a full color module capable of reproducing the UWCG color gamut, and in particular, a manufacturing method of the RGCB-pixel (111 in FIG. 2) is described in detail. In this case, as described above, when mentioning the pixel unit required for realizing full color on the basis of emitting light color, the pixel unit is generally referred to as RGCB-pixel for both the UWCG-1 and UWCG-2 color gamut. However, for the case it is necessary to explicitly indicate the number of light sources in the pixel, the pixel unit is referred to as RGCB-pixel or RGGCB-pixel.

FIG. 4. is a plane pattern diagram of RGCB-pixels 111; 111-1, 111-2 to reproduce the UWCG color gamut as an embodiment of the present invention. FIG. 4 shows the RGCB-pixel 111-1 composed of four-color light sources in the full-color display module for reproduction of the UWCG-1 color gamut in FIG. 1, and FIG. 4 is RGCB-pixels (111-2) composed of five color light sources in the full-color display module for reproduction of the UWCG-2 color gamut in FIG. 1. As described above, for the case the LED array layer 10 is composed of two types of a blue-light LED and a cyan-light LED, the blue-light source B and cyan-light source C are the LEDs themselves without phosphor, while the red-light source R and the green-light source G are configured by combining the LEDs and phosphors. And further, RGCB-pixels 111; 111-1, 111-2 of the full-color display modules for reproducing full colors of the UWCG-1 and UWCG-2 color gamut is described as follows in more detail.

In the case of the RGCB-pixel 111-1 in FIG. 4, two blue-light LEDs with a peak wavelength of 455 to 470 nm and two cyan-light LEDs with a peak wavelength of 490 to 510 nm are arranged in a square shape as in the embodiment to configure the full-color pixel of the unit LED array layer 10. The RGCB-pixel 111-1 consists of four light sources; a blue-light LED, another blue-light LED combined with green light phosphor 1 for converting blue-light into green light with a peak wavelength of 520 to 535 nm, a cyan-light LED and another cyan-light LED combined with red light phosphor for converting cyan light into red light of the corresponding peak wavelength.

In the case of the RGGCB-pixel 111-2 in FIG. 4, three blue-light LEDs with a peak wavelength of 455 to 470 nm and two cyan-light LEDs with a peak wavelength of 490 to 510 nm are arranged in a pentagonal shape as in the embodiment. The full-color pixel of the unit LED array 10 is constructed with; a blue-light LED (B), another blue-light LED combined with green phosphor 2 for converting to green light with a peak wavelength of 515 to 530 nm, the other blue-light LED combined with green-light phosphor 3 for converting to green light with a peak wavelength of 540 to 560 nm, a cyan-light LED, and another cyan-light LED combined with a red-light phosphor for converting cyan light into red light of the corresponding peak wavelength.

In the case of actually manufacturing the full-color display module, it is desirable to make the LED array layer 10 in the full-color display module connected the electrodes by stacking on the TFT layer 105 as a driving switching element as described above. In addition, the full-color display module may optionally further include an optical film 145 mounted on the light emitting surface side of the LED array layer 10. The optical film 145 must be opaque to stop the penetration of visible light in whole area except the part of the pixel pattern corresponding to the pixel of the related LED array layer 10. Accordingly, the pixel pattern of the optical film 145 is intended to transmit visible light, but a phosphor for converting blue light or cyan light emitting from the LED into green light or red light is formed at a specific location of the pixel patterned on the optical film 145.

Meanwhile, in the at least one LED array layer 10, the at least one layer LED 11 may be formed on the same layer, but, it is preferable to form the at least one LED array layer 10 with a structure in which different-color (blue or cyan) LED elements are provided on different layers for each type, in terms of manufacturing process for mass production of the full-color display module, technical difficulties in chip integration, and manufacturing cost. In this case, it is preferable to form the full-color display module with a plurality of the sets, each of which is assembled with each of the plurality of TFT layers 105, the at least one optical film 145, and each of the plurality LED array layers 10.

Figure 7:
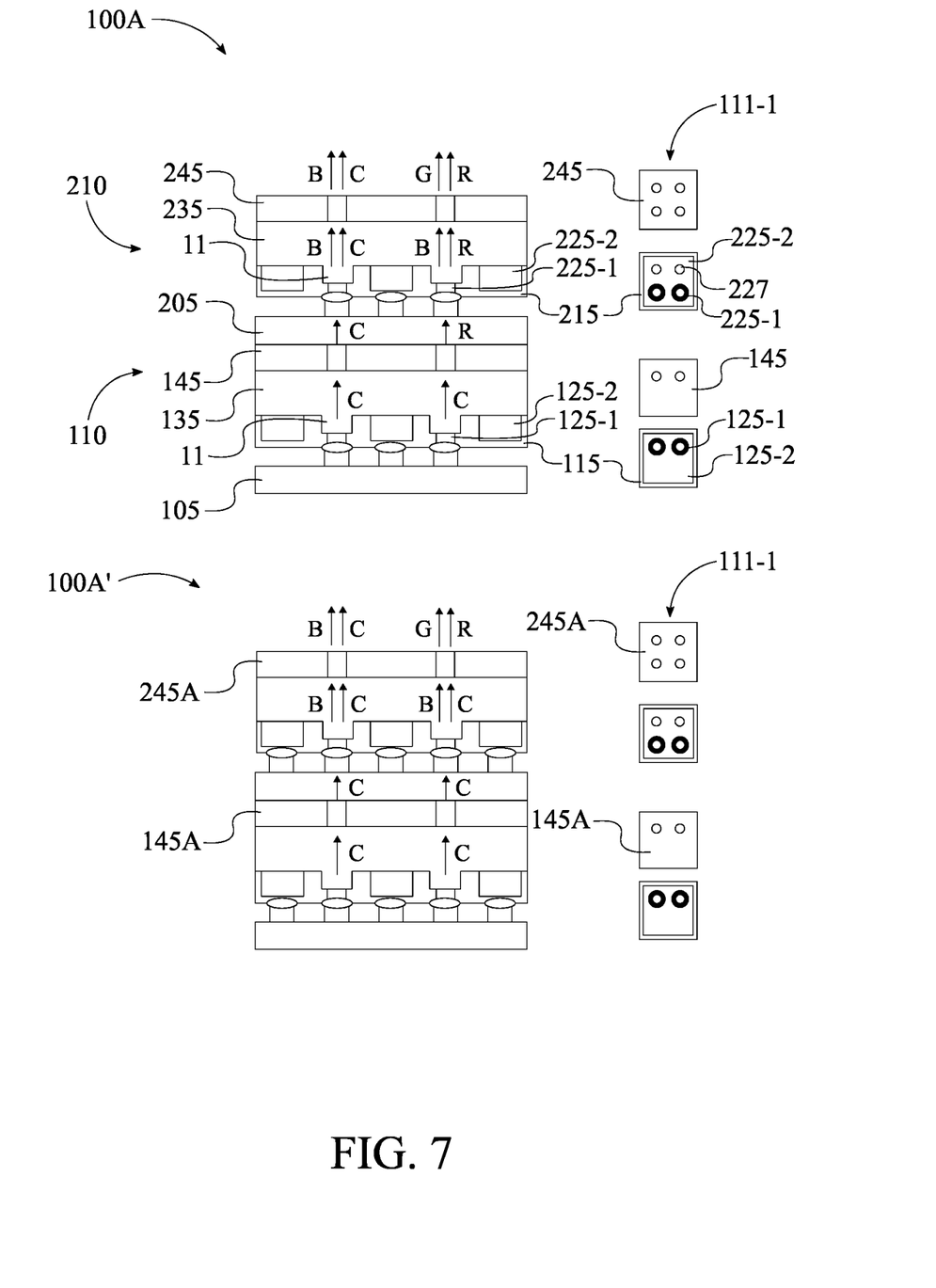
FIG. 7 is a cross-sectional view of two embodiments of the present invention.
Figure 8:
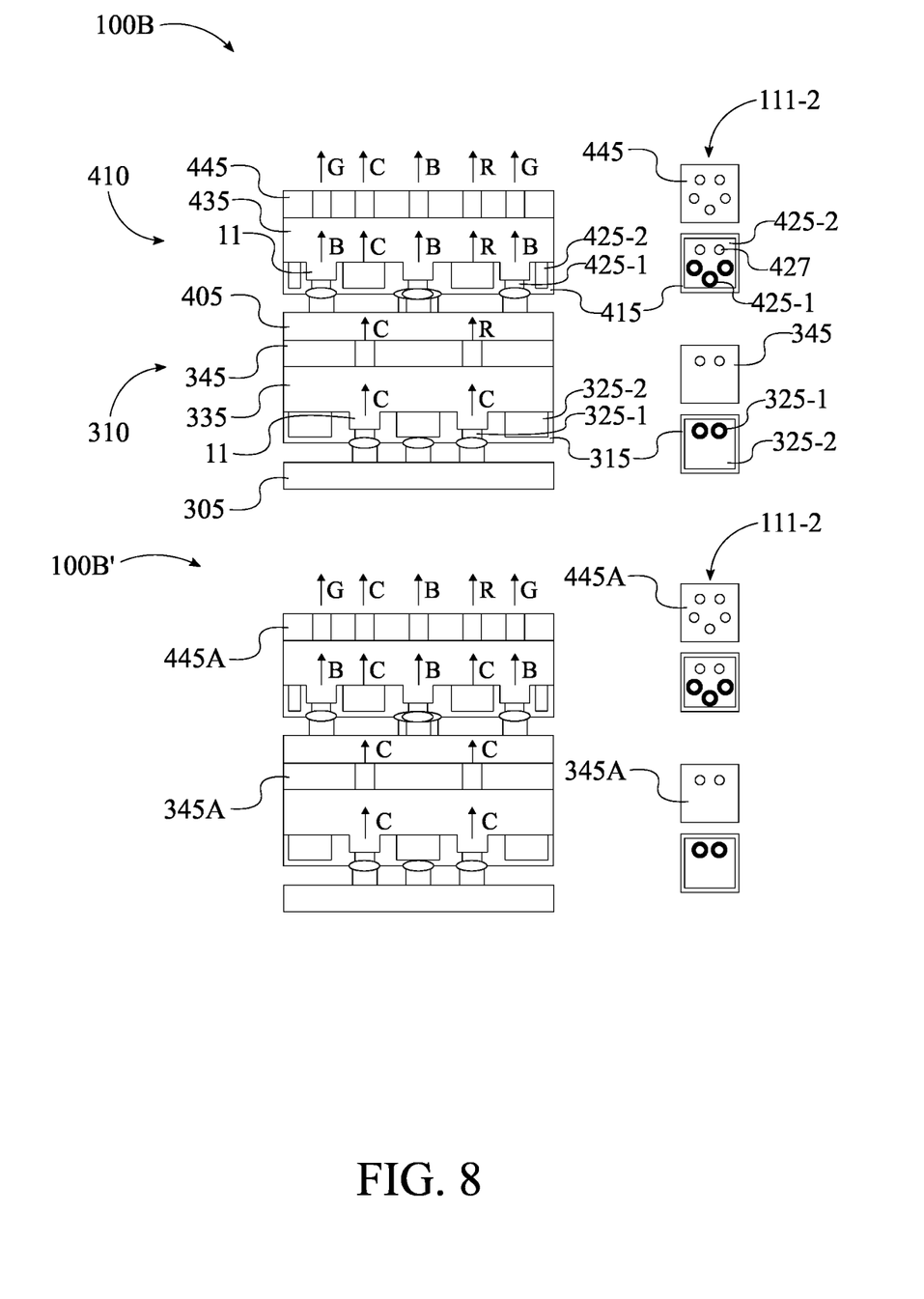
FIG. 8 is a cross-sectional view of two other embodiments of the present invention.

FIGS. 7 and 8 are cross-sectional views of a full-color display module in which the plurality of LED array layers are stacked in an up-down direction to reproduce the UWCG-1 and UWCG-2 gamut in FIG. 1, respectively. A schematic diagram of a structure and a plan view of an emission light pattern in each layer is shown. In FIGS. 7 and 8, the number of LED array layers in each full-color display module may be determined according to the number of LED types used, and two types of blue-light LED and cyan-light LED are used in the embodiments of FIGS. 7 and 8. That is, the blue-light LED array (hereafter, abbreviated as 'B-array'), composed of the blue-light LEDs arranged to form the BG-pixel or BGG-pixel pattern (hereinafter, collectively referred to as BG-pixel) constituting the RGCB-pixel 111; 111-1, 111-2 of the present invention, is located at the top, and the cyan-light LED array (hereafter, abbreviated as 'C-array'), composed of the cyan-light LEDs arranged to form the RC-pixel pattern constituting the RGCB-pixel 111; 111-1, 111-2 of the present invention, is located at the bottom in the full-color display module. In the description below, the BG-pixel is indicated as B-array pixel and the RC-pixel is indicated as C-array pixel. Accordingly, the final RGCB-pixel pattern of the full-color display module corresponds to a pattern that is combined by orthogonally projecting the pixel patterns of the B-array and C-array, which are a plurality of aligned and stacked LED array layers. In this case, the B-array and the C-array may be stacked in reverse arrangement order, and also, B-array pixel and C-array pixel are formed by integrating B-array and C-array with each of the plurality of TFT layers 105 and the at least one optical film 145 patterned with the corresponding phosphor, respectively.

Referring to FIG. 7, in order to manufacture RGCB-pixel 111-1 based full-color display modules capable of reproducing the UWCG-1 color gamut according to an embodiment of the present invention 100A, 100A', for the C-Array 110, the C-Array pixel as a basic component of the full-color display modules 100A, 100A' consisting of two cyan-light Hybrid micro-LEDs with a peak wavelength of 490 to 510 nm is made in a monolithic process method, while for the B-Array 210, the B-Array pixel as another basic component of the full-color display modules 100A, 100A' consisting of two blue-light Hybrid micro-LEDs with a peak wavelength of 455 to 470 nm is made in a monolithic process. In this case, the C-Array pixel and the B-Array pixel are similar in size each other. and when the C-Array and B-Array layers 110, 210 are being assembled at the bottom and top (or in reverse), the light emitting faces of Hybrid micro-LEDs in each layer should be aligned not to overlap each other in the vertical direction, in order to form the RGCB-pixel 111-1 as an unit pixel of the full-color display modules 100A, 100A' by orthogonally projecting the pixel patterns of the B-Array and the C-Array.

For Hybrid micro-LED constituting the above-described C-Array pixel 11- and B-Array pixel 210, the p-electrode 125-1/225-1 and n-electrode 125-2/225-2 are formed on the mesa surface and the surface of the n-type nitride semiconductor exposed by etching, respectively, in order to apply a conventional flip-chip bonding process for connecting the TFT layer in sequential. In this case, in order not to interfere with the light emitting from the C-Array pixel at the bottom by the n-electrode metal of the B-Array pixel at the top, when stacked the C-Array pixel and B-Array pixel layers 110, 210, the n-electrode 225-2 is not formed on n-electrode metal exclusion area 227 in the region of the n-type nitride semiconductor of the B-Array, located at the center axis of the micro-LED 11 in the C-Array pixel, which is preferably in shape and size similar to that of Hybrid micro-LED 11 of the C-Array pixel.

For the above-described Hybrid micro-LED 11, a passivation layer 115/215 is deposited on the whole surface for insulation except partial surface of the electrode to be connected by flip-chip bonding.

In order to electrically control each of Hybrid micro-LEDs 11 constituting the C-Array 110 and B-Array 210, an electrode is connected to the at least one TFT layer 105/205 with a flip-chip bonding method. In this case, the at least one TFT layer 205 connected to the upper B-Array 210 is made of a transparent material that allows light emitting from the lower C-Array pixel to pass well.

In the full-color display modules 100A, 100A', optical films, passing only light traveling in a vertical direction, are mounted on the at least one substrate 135/235 that is preferably transparent, The finished optical films 145/245, 145A/245A may be aligned and mounted on the surface of the at least one substrate 135/235 that is preferably made of sapphire by lamination process technology, or directly deposited on the surface of the at least one substrate through micro fabrication process. A lower optical film 145/145A of at least one optical film is a pixelated optical film for the C-Array pixel, and a upper optical film 245/245A of the at least one optical film is a pixelated optical film for the B-Array pixel. The above-described optical film has the pixel pattern corresponding to the pixel of the 'related LED array layer'. For example, the at least one LED array layer related to the formation of the pixel pattern of the lower optical film 145/145A is the C-Array alone, and the pixel of the lower optical film 145/145A is the same pattern as the C-Array pixel, and the at least one LED array layer related to the pixel pattern formation of the upper optical film is both the B-Array and the C-Array. Therefore, the pixel of the upper optical film 245/245A is the same pattern as one formed by combining the B-Array pixel and the C-Array pixel in a orthogonal projection way. The pixels formed in the upper and lower optical films are similar in size and shape as Hybrid micro-LED 11 of the B-Array and the C-Array and aligned at the center axis of Hybrid micro-LED 11. The discrete film section is formed with the red-light phosphor and/or the green light phosphor, and the continuous film section is opaque in visible light.

As an embodiment example of FIG. 7, the lower optical film 145 in the full-color display module 100A consists of two pixels; one is transparent to pass without absorption of cyan light with a peak of 490 nm to 510 nm emitting from the C-Array pixel, and the another pixel is formed of a red-light phosphor capable of converting cyan light with a peak wavelength of 490 nm to 510 nm into red light with a peak wavelength of 630 nm to 660 nm. On the other hand, in another embodiment of FIG. 7, the lower optical film 145A in the full-color display module 100A' consists of two pixels of transparent in visible light to pass without absorption of cyan light with a peak wavelength 490 to 510 nm peaks emitting from the C-Array pixel.

Meanwhile, the choice of the upper optical film is depended on the lower optical film. For example, the upper optical film 245, shown in FIG. 7, consist of a total of four pixels; three of the four pixels are transparent to pass without absorption of cyan light with a peak wavelength of 490 nm to 510 nm, red light with a peak wavelength of 630 nm to 660 nm emitting from the lower C-Array pixel, and blue light with a peak wavelength of 455 nm to 470 nm emitting from the B-Array pixel, and the remaining one pixel is formed of the green-light phosphor capable of converting blue light with a peak wavelength of 455 nm to 470 nm emitting from the B-array pixel into green light with a peak wavelength of 520 nm to 535 nm. On the other hand, for the upper optical film 245 A in FIG. 7 consists of a total of four pixels similar in shape as the optical film 245; two of the four pixels are transparent to pass cyan light with a peak wavelength of 490 nm to 510 nm emitting from the lower C-Array pixel and blue light with a peak wavelength of 455 nm to 470 nm emitting from the upper B-Array pixel, and the other two pixels are formed of the red-light phosphor capable of converting cyan light to red light with a peak wavelength of 630 nm to 660 nm, and the green-light phosphor capable of converting blue light with a peak wavelength of 455 nm to 470 nm to green light with a peak wavelength of 520 nm to 535 nm.

FIG. 8 shows another embodiment of how to manufacture the RGGCB-pixel 111-2 based full-color display module 100B, 100B' reproducing the UWCG-2 color gamut. The C-Array 310 is configured with the C-Array pixel composed of a pixel unit consisting of two Hybrid micro-LEDs emitting cyan light with a peak wavelength of 490 nm to 510 nm and the B-Array 410 is configured with the B-Array pixel composed of a pixel unit consisting of three Hybrid micro-LEDs emitting blue light with a peak wavelength of 455 nm to 470 nm. The B-array and the C-array can be fabricated in a monolithic process. The C-Array pixel and the B-Array pixel are similar in size, and when stacking each other at the bottom or top, the light emitting faces of Hybrid micro-LEDs are aligned not to overlap each other in the vertical direction to configure the final RGGCB-pixel 111-2 of the full-color display module 100B, 100B', which is the pattern formed by orthogonally projecting each pixel pattern of the B-Array and C-Array.

Meanwhile, the p-electrode 325-1/425-1, the n-electrode 325-2/425-2, and the n-electrode metal exclusion region 427, the passivation layer 315/415 and the at least one TFT layer 305/405 of the full-color display module 100B, 100B' in FIG. 8 are identically described as in FIG. 7. Also, the configurations of the at least one optical film 345/445, 345A/445A, at least one substrate 335/435 in the full-color display module 100B, 100B' in the embodiment of FIG. 8 are basically the same as ones in FIG. 7. The at least one optical film in FIG. 8 and FIG. 7 may be identically described; that is, as FIG. 7, the lower optical film 345, 345A in FIG. 8 is an optical film pixelated for the C-Array pixel, and the upper optical film 445, 445A in FIG. 8 is an optical film pixelated for the B-Array and the C-array pixels. The optical films in FIG. 8 and FIG. 7 are identical each other in terms of pixelization method of forming two pixels and the shape of the upper optical film 445, 445A dependent on the shape of the lower optical film 345, 345A. As described below, the only difference is the number of pixels in FIG. 8 and FIG. 7; that is, the upper optical film 445, 445A in FIG. 8 composed of five pixels, while the upper optical film 245, 245A in FIG. 7 composed of four pixels as described below.

FIG. 8 is an embodiment of the upper optical film 445 composed of a total of five pixels; three out of five pixels are configured to pass without absorption of cyan light with a peak wavelength of 490 nm to 510 nm and red light with a peak wavelength of 630 nm to 660 nm emitting from the C-Array pixel, as well as blue light with a peak wavelength of 455 nm to 470 nm emitting from the B-Array pixel, and the other two pixels are formed of the first green-light phosphor and the second green-light phosphor to convert blue light, emitting from the B-Array, with a peak wavelength of 455 nm to 470 nm into green light with a peak wavelength of 515 nm to 530 nm and green light with a peak wavelength of 540 nm to 560 nm, respectively.

FIG. 8 is an embodiment of the upper optical film 445A composed of a total of five pixels; two out of five pixels are configured to pass without absorption of cyan light with a peak wavelength of 490 nm to 510 nm emitting from the C-Array pixel and blue light with a peak wavelength of 455 nm to 470 nm emitting from the B-Array pixel, and the other three pixels are formed of the red-light phosphor, the first green-light phosphor, and the second green-light phosphor, to convert cyan light, emitting from the C-Array, into red light with a peak wavelength of 630 nm to 660 nm, and blue light, emitting from the B-Array, into green light with a peak wavelength of 515 nm to 530 nm and green light with a peak wavelength of 540 nm to 560 nm, respectively.

The full-color display module based on the RGCB-pixel 111-1 or RGGCB-pixel 111-2 may be manufactured with Hybrid micro-LED arrays 110/210, 310/410 as the embodiment of FIG. 7 and FIG. 8. And further, the UWCG-class micro-LED display panel 1000 in different sizes and shapes can be assembled by using a plurality of full-color display modules claimed in this invention.

As described above, the full-color display module may be assembled with the RGCB-pixel of four light sources of red, green, cyan, and blue with a specific wavelength range claimed in the present invention. Further, the display panel composed of the above-described full-color display modules can reproduce all colors of UWCG color gamut, which are much broader and richer than the colors of BT. 2020 WCG color gamut. The full-color display module in this invention may be configured with one or more LED arrays manufactured in a monolithic manner, and UWCG-class LED display panels in various sizes can be manufactured at high production speed by using a plurality for the full-color display modules. In this case, if the full-color display module is formed with Hybrid micro-LED, the durability of the full-color display module may be improved because Hybrid micro-LED increase the luminous efficiency and reduce the leakage current. In addition, since the degree of integration can further be increased by vertically stacking a plurality of LED arrays as described above, not only the display brightness and the color richness but also the resolution can also be improved.

The above embodiments in the present invention are not limit the disclosed matters or the scope of the present invention but for the purpose of explanation. It should be understood that those of ordinary skill in the corresponding display area can make various changes and modifications without departing from the essence of the present invention.

Specifically, the RGCB-pixel using a micro-LED array capable of implementing a color gamut of UWCG (Ultra-Wide Color Gamut) may be achieved in various ways other than the embodiments of FIGS. 4, 7, and 8, and furthermore, the number of light sources of the RGCB-pixel or the shape of the pixels may be changed for other purposes such as reinforcing the light intensity of a color light source with a specific wavelength in some cases.

Although the invention has been explained in relation to its preferred embodiment, it is to be understood that many other possible modifications and variations can be made without departing from the spirit and scope of the invention as hereinafter claimed.

What is claimed is:

1. A full-color display module with an ultra-wide color gamut comprising:
    at least one red-light source;
    at least one green-light source;
    at least one cyan-light source;
    at least one blue-light source;
    at least one substrate;
    the at least one red-light source being configured to emit at a peak wavelength of 630 nanometers (nm) to 660 nm;
    the at least one green-light source being configured to emit at a peak wavelength of 515 nm to 560 nm;
    the at least one cyan-light source being configured to emit at a peak wavelength of 490 nm to 510 nm;
    the at least one blue-light source being configured to emit at a peak wavelength of 455 nm to 470 nm; and
    the at least one red-light source, the at least one green-light source, the at least one cyan-light source, and the at least one blue-light source being mounted onto the at least one substrate.

2. The full-color display module with an ultra-wide color gamut as claimed in claim 1 comprising:
    the at least one green-light source being a single green-light source; and
    the single green-light source being configured to emit at a peak wavelength of 520 nm to 535 nm.

3. The full-color display module with an ultra-wide color gamut as claimed in claim 1 comprising:
    the at least one green-light source being a plurality of green-light sources;
    the plurality of green-light sources comprising a first green-light source and a second green-light source;
    the first green-light source being configured to emit at a peak wavelength of 515 nm to 530 nm; and
    the second-green light source being configured to emit at a peak wavelength of 540 nm to 560 nm.

4. The full-color display module with an ultra-wide color gamut as claimed in claim 1 comprising:

the at least one green-light source comprising at least one blue-light light-emitting diode (LED) and at least one green-light phosphor; and the at least one green-light phosphor being configured to convert blue light from the at least one blue-light LED into green light.

5. The full-color display module with an ultra-wide color gamut as claimed in claim 4, wherein a p-type layer of the at least one blue-light LED is made of gallium nitride (GaN).

6. The full-color display module with an ultra-wide color gamut as claimed in claim 4, wherein the at least one blue-light LED is at least one Hybrid LED, and wherein a p-type layer of the at least one hybrid LED is made of GaN and zinc oxide (ZnO).

7. The full-color display module with an ultra-wide color gamut as claimed in claim 1, wherein the at least one blue-light source is at least one blue-light LED.

8. The full-color display module with an ultra-wide color gamut as claimed in claim 7, wherein a p-type layer of the at least one blue-light LED is made of GaN.

9. The full-color display module with an ultra-wide color gamut as claimed in claim 7, wherein the at least one blue-light LED is at least one Hybrid LED, and wherein a p-type layer of the at least one hybrid LED is made of GaN and ZnO.

10. The full-color display module with an ultra-wide color gamut as claimed in claim 1, wherein the at least one cyan-light source is at least one cyan-light LED.

11. The full-color display module with an ultra-wide color gamut as claimed in claim 7, wherein a p-type layer of the at least one cyan-light LED is made of GaN.

12. The full-color display module with an ultra-wide color gamut as claimed in claim 7, wherein the at least one cyan-light LED is at least one Hybrid LED, and wherein a p-type layer of the at least one hybrid LED is made of GaN and ZnO.

13. The full-color display module with an ultra-wide color gamut as claimed in claim 1 comprising:
the at least one red-light source comprising at least one cyan-light LED and at least one red-light phosphor; and
the at least one red-light phosphor being configured to convert cyan light from the at least one cyan-light LED into red light.

14. The full-color display module with an ultra-wide color gamut as claimed in claim 13, wherein a p-type layer of the at least one cyan-light LED is made of GaN.

15. The full-color display module with an ultra-wide color gamut as claimed in claim 13, wherein the at least one cyan-light LED is at least one Hybrid LED, and wherein a p-type layer of the at least one hybrid LED is made of GaN and ZnO.

16. The full-color display module with an ultra-wide color gamut as claimed in claim 1 comprising:
the at least one red-light source comprising at least one blue-light LED and at least one red-light phosphor; and
the at least one red-light phosphor being configured to convert blue light from the at least one blue-light LED into red light.

17. The full-color display module with an ultra-wide color gamut as claimed in claim 16, wherein a p-type layer of the at least one blue-light LED is made of GaN.

18. The full-color display module with an ultra-wide color gamut as claimed in claim 16, wherein the at least one blue-light LED is at least one Hybrid LED, and wherein a p-type layer of the at least one hybrid LED is made of GaN and ZnO.

19. The full-color display module with an ultra-wide color gamut as claimed in claim 1 comprising:
at least one thin-film transistor (TFT) layer;
the at least one red-light source, the at least one green-light source, the at least one blue-light source, the at least one cyan-light source, and the at least one substrate being arranged into at least one LED array layer;
the at least one TFT layer being stacked onto the at least one LED array layer; and
the at least one LED array layer being electronically connected to the at least one TFT layer.

20. The full-color display module with an ultra-wide color gamut as claimed in claim 19 comprising:
the at least one LED array layer comprising a first blue-light LED, a second blue-light LED, a first cyan-light LED, and a second cyan-light LED, a green-light phosphor, and a red-light phosphor;
the green-light phosphor being configured to convert blue-light from the first blue-light LED into green light with at a peak wavelength of 520 nm to 535 nm; and
the red-light phosphor being configured to convert cyan light from the first cyan-light LED into red light.

21. The full-color display module with an ultra-wide color gamut as claimed in claim 19 comprising:
the at least one LED array layer comprising a first blue-light LED, a second blue-light LED, a third blue-light LED, a first cyan-light LED, and a second cyan-light LED, a first green-light phosphor, a second green-light phosphor, and a red-light phosphor;
the first green-light phosphor being configured to convert blue light of the first blue-light LED into green light with a peak wavelength of 515 nm to 530 nm;
the second green-light phosphor being configured to convert blue light of the second blue-light LED into green light with a peak wavelength of 540 nm to 560 nm; and
the red-light phosphor being configured to convert cyan light from the first cyan-light LED into red light.

22. The full-color display module with an ultra-wide color gamut as claimed in claim 19 comprising:
the at least one LED array layer comprising a first blue-light LED, a second blue-light LED, a third blue-light LED, a first cyan-light LED, and a second cyan-light LED, a green-light phosphor, a first red-light phosphor, and a second red-light phosphor;
the green-light phosphor being configured to convert blue light of the first blue-light LED into green light with a peak wavelength of 520 nm to 535 nm;
the first red-light phosphor being configured to convert blue light of the second blue-light LED into red light; and
the second red-light phosphor being configured to convert cyan light from the first cyan-light LED into red light.

23. The full-color display module with an ultra-wide color gamut as claimed in claim 19 comprising:
the at least one LED array layer being a plurality of LED array layers;
the at least one TFT layer being a plurality of TFT layers;
each of the plurality of TFT layers being stacked onto a corresponding LED array layer from the plurality of LED array layers forming a plurality of layer pairs; and
the plurality of layer pairs being configured to orthogonally project at least one pixel pattern from each of the plurality of LED array layers.

24. The full-color display module with an ultra-wide color gamut as claimed in claim 23 comprising:
the plurality of LED array layers comprising a blue-light LED array layer and a cyan-light LED array layer;

each of the plurality of LED array layers comprising at least one layer LED;
the at least one layer LED of the blue-light LED array layer being arranged into a blue-green-pixel (BG-pixel) pattern; and
the at least one layer LED of the cyan-light LED array layer being arranged into a red-cyan-pixel (RC-pixel) pattern.

25. The full-color display module with an ultra-wide color gamut as claimed in claim 23 comprising:
the plurality of LED array layers comprising a blue-light LED array layer and a cyan-light LED array layer;
each of the plurality of LED array layers comprising at least one layer LED;
the at least one layer LED of the blue-light LED array layer being arranged into a blue-green-red-pixel (BGR-pixel) pattern; and
the at least one layer LED of the cyan-light LED array layer being arranged into a red-cyan-pixel (RC-pixel) pattern.

26. The full-color display module with an ultra-wide color gamut as claimed in claim 19 comprising:
at least one optical film;
the at least one LED array layer comprising at least one layer LED;
the at least one optical film comprising at least one discrete film section and a continuous film section;
the at least one optical film being stacked onto the at least one LED array layer, opposite the at least one TFT layer;
the at least one discrete film section being surround by the continuous film section;
the at least one discrete film section being in optical communication with the at least one layer LED; and
the surrounding film section being opaque in visible light.

27. The full-color display module with an ultra-wide color gamut as claimed in claim 26 comprising:
at least one green-light phosphor; and
the at least one green-light phosphor being integrated into the at least one discrete film section.

28. The full-color display module with an ultra-wide color gamut as claimed in claim 26 comprising:
at least one red-light phosphor; and
the at least one red-light phosphor being integrated into the at least one discrete film section.

* * * * *